(12) United States Patent
Lee et al.

(10) Patent No.: US 12,261,149 B2
(45) Date of Patent: Mar. 25, 2025

(54) MANUFACTURING METHOD OF SEMICONDUCTOR STRUCTURE

(71) Applicant: Powerchip Semiconductor Manufacturing Corporation, Hsinchu (TW)

(72) Inventors: Shih-Ping Lee, Hsinchu (TW); Shih-Hsorng Shen, Hsinchu (TW); Chih-Wei Su, Hsinchu (TW); Yu-Chun Huo, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 433 days.

(21) Appl. No.: 17/874,332

(22) Filed: Jul. 27, 2022

(65) Prior Publication Data
US 2023/0402426 A1 Dec. 14, 2023

(51) Int. Cl.
*H01L 21/00* (2006.01)
*H01L 23/00* (2006.01)

(52) U.S. Cl.
CPC .............. *H01L 24/80* (2013.01); *H01L 24/08* (2013.01); *H01L 2224/08145* (2013.01);
(Continued)

(58) Field of Classification Search
CPC ........... H01L 24/80; H01L 2224/80895; H01L 2224/80896; H01L 2224/80908; H01L 2924/3511; H01L 21/3205; H01L 2224/85205; H01L 2224/04042; H01L 2224/05567; H01L 2924/35121; H01L 2224/05558; H01L 2224/4847; H01L 2924/3512; H01L 2224/08145;
(Continued)

(56) References Cited

U.S. PATENT DOCUMENTS 6,351,384 B1 * 2/2002 Daikoku ................. F28F 13/12
361/689
6,388,328 B1 * 5/2002 Doyle ............... H01L 21/76834
257/E21.576

(Continued)

FOREIGN PATENT DOCUMENTS

CN 107731668 11/2018
TW 200504823 2/2005

OTHER PUBLICATIONS

"Office Action of Taiwan Counterpart Application", issued on May 3, 2023, p. 1-p. 7.

*Primary Examiner* — Niki H Nguyen
(74) *Attorney, Agent, or Firm* — JCIPRNET

(57) ABSTRACT

A manufacturing method of a semiconductor structure including the following steps is provided. A first substrate is provided. A first dielectric structure is formed on the first substrate. At least one first cavity is formed in the first dielectric structure. A first stress adjustment layer is formed in the first cavity. The first stress adjustment layer covers the first dielectric structure. A second substrate is provided. A second dielectric structure is formed on the second substrate. At least one second cavity is formed in the second dielectric structure. A second stress adjustment layer is formed in the second cavity. The second stress adjustment layer covers the second dielectric structure. The first stress adjustment layer and the second stress adjustment layer are bonded.

19 Claims, 12 Drawing Sheets

(52) U.S. Cl.
CPC .............. *H01L 2224/80031* (2013.01); *H01L 2224/80895* (2013.01); *H01L 2224/80896* (2013.01); *H01L 2224/80908* (2013.01); *H01L 2924/3511* (2013.01)

(58) Field of Classification Search
CPC .......... H01L 23/481; H01L 2224/0401; H01L 2224/16; H01L 2224/73253; H01L 21/4825; H01L 21/4853; H01L 21/76224; H01L 21/84; H01L 2224/13024; H01L 2224/16237; H01L 2224/48225; H01L 23/12; H01L 23/48; H01L 23/49816; H01L 23/5386; H01L 23/544; H01L 2224/16227; H01L 2225/06524; H01L 23/3107; H01L 23/3128

See application file for complete search history.

(56) References Cited

U.S. PATENT DOCUMENTS

| | | | |
|---|---|---|---|
| 7,978,473 B2* | 7/2011 | Campbell | H01L 23/473 228/183 |
| 8,053,336 B2 | 11/2011 | Wu et al. | |
| 9,589,933 B2 | 3/2017 | Yu et al. | |
| 2006/0042825 A1* | 3/2006 | Lu | F28D 15/0266 257/E23.09 |
| 2013/0020704 A1* | 1/2013 | Sadaka | H01L 24/03 438/455 |
| 2014/0252585 A1* | 9/2014 | Chen | H01L 33/648 257/692 |
| 2015/0357260 A1* | 12/2015 | Ankireddi | H05K 7/20927 361/699 |
| 2018/0211900 A1* | 7/2018 | Gutala | G11C 7/04 |
| 2020/0352053 A1* | 11/2020 | Mizerak | H01L 23/4735 |
| 2021/0134694 A1* | 5/2021 | Li | H01L 21/76898 |
| 2021/0280544 A1* | 9/2021 | Chen | H01L 24/06 |
| 2022/0139851 A1* | 5/2022 | Chang | H01L 25/0657 257/734 |
| 2022/0230937 A1* | 7/2022 | Malouin | H01L 23/473 |

* cited by examiner

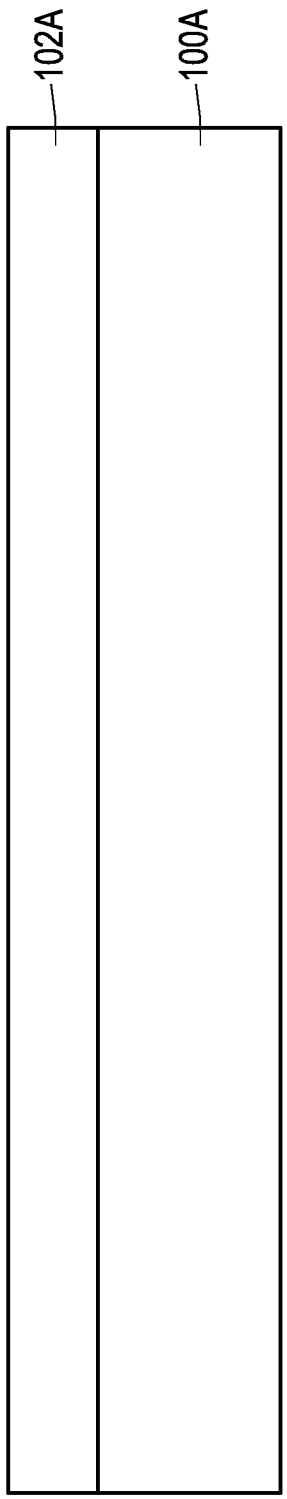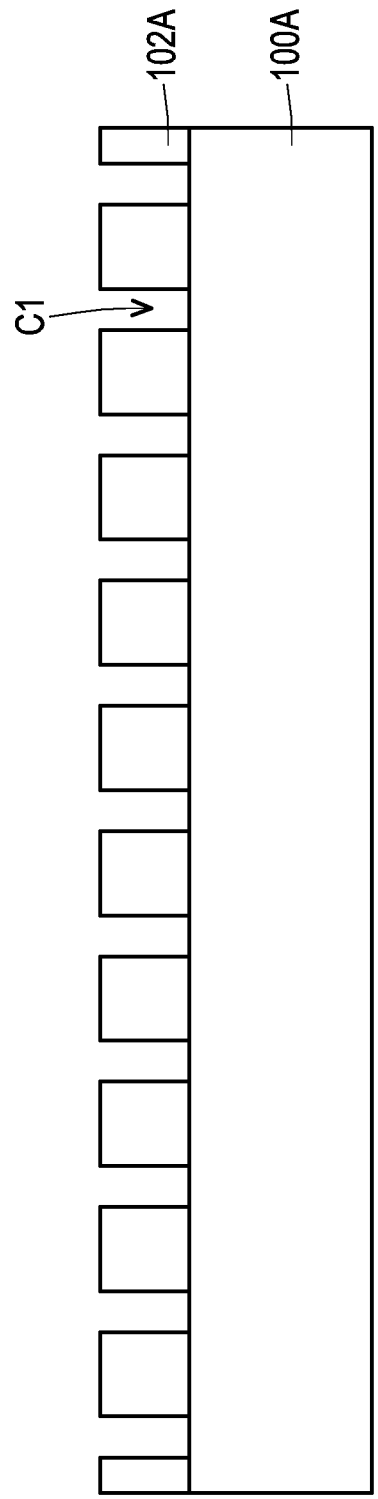

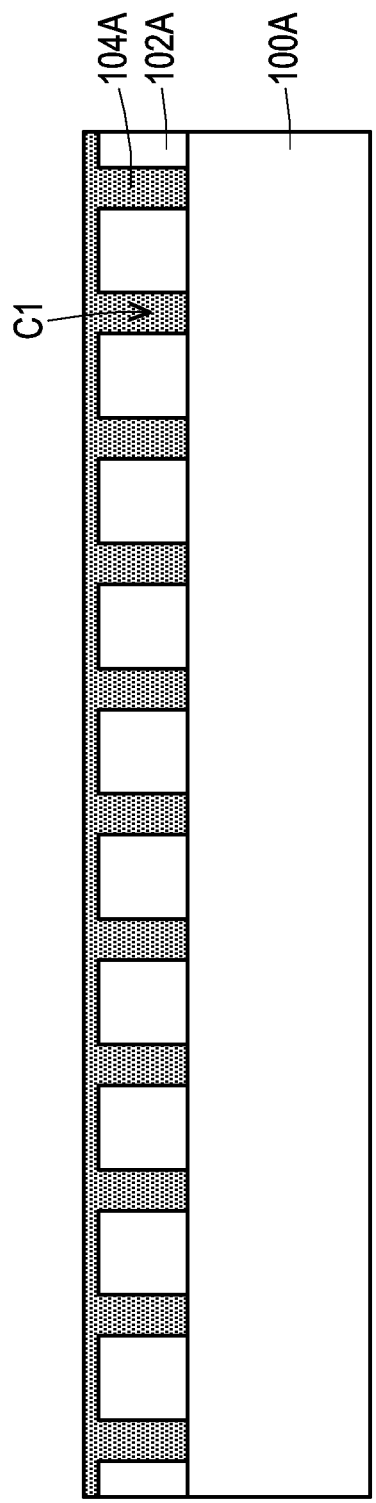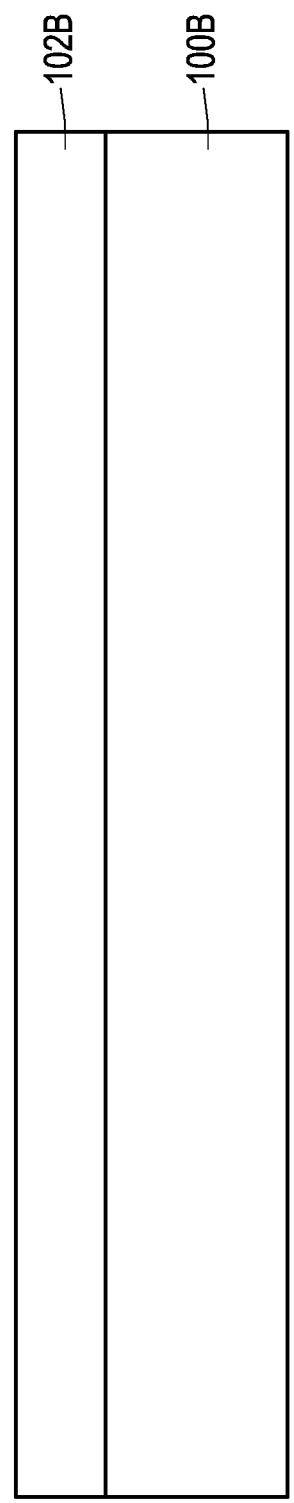

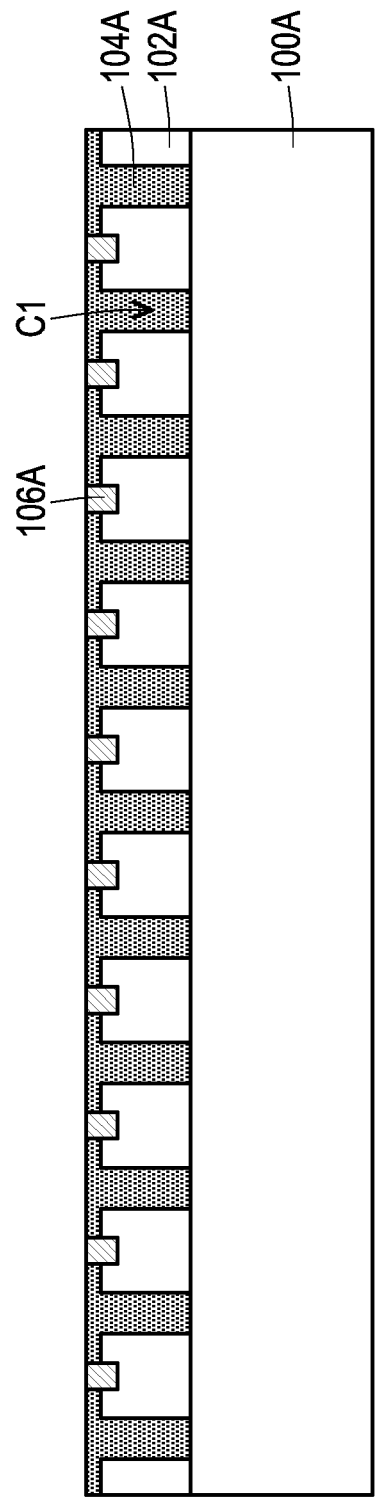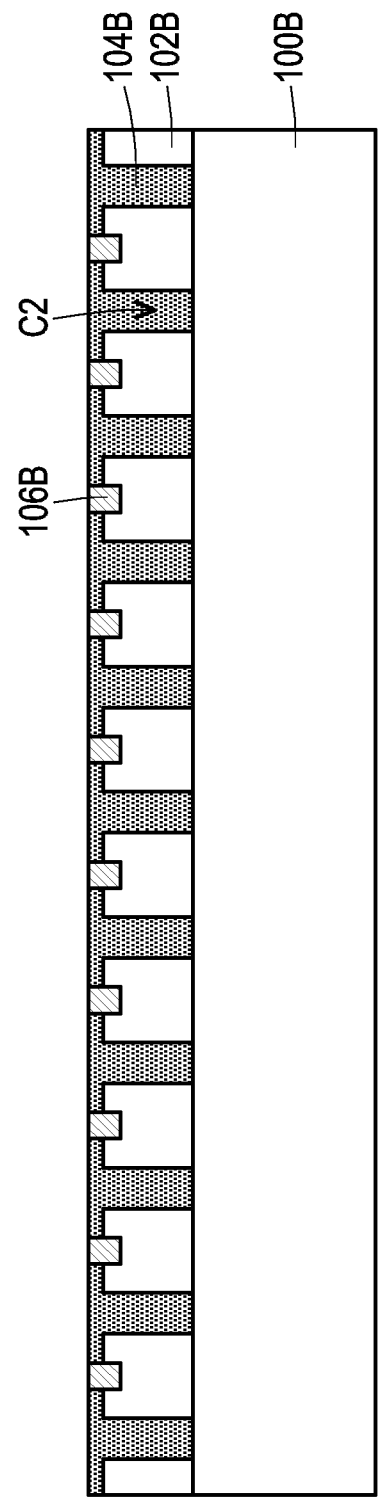
FIG. 3A
FIG. 3B

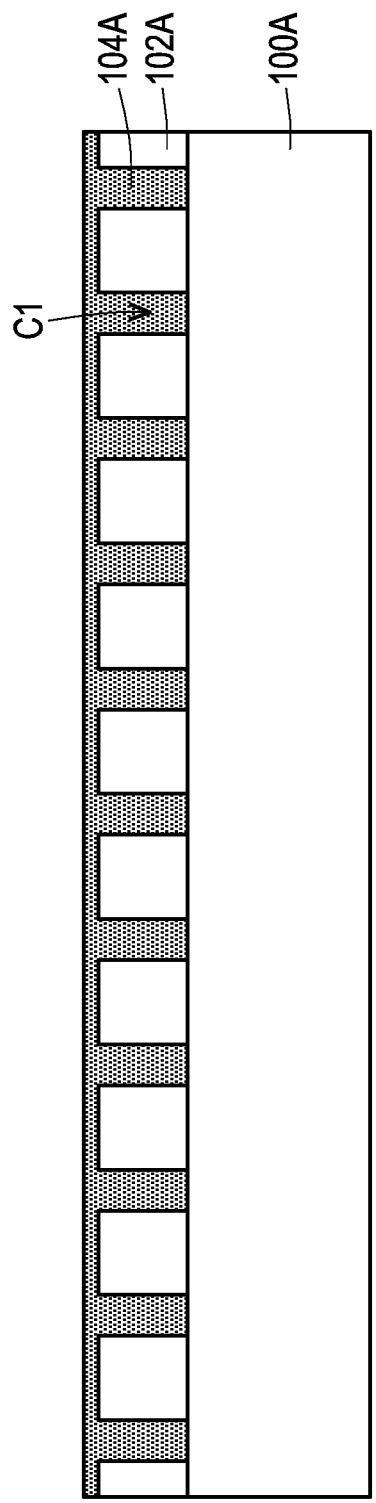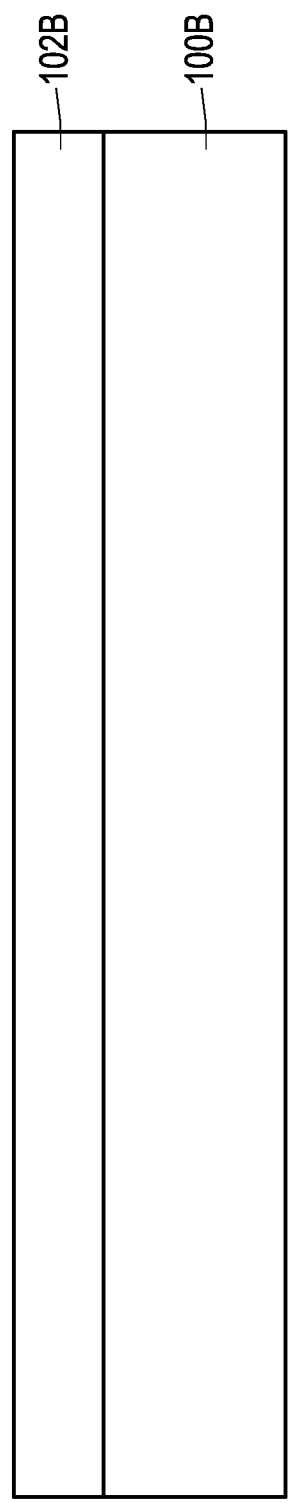
FIG. 4A
FIG. 4B

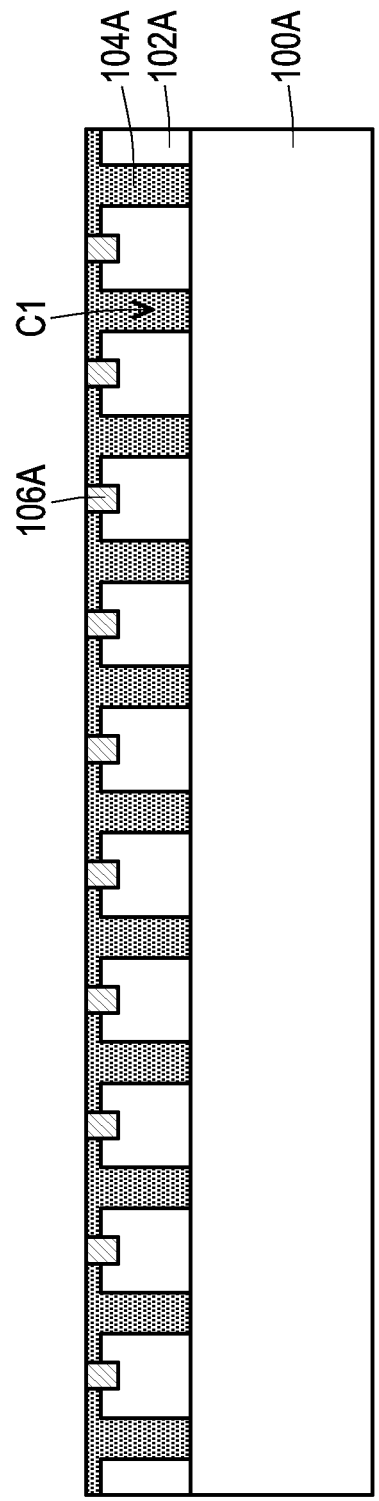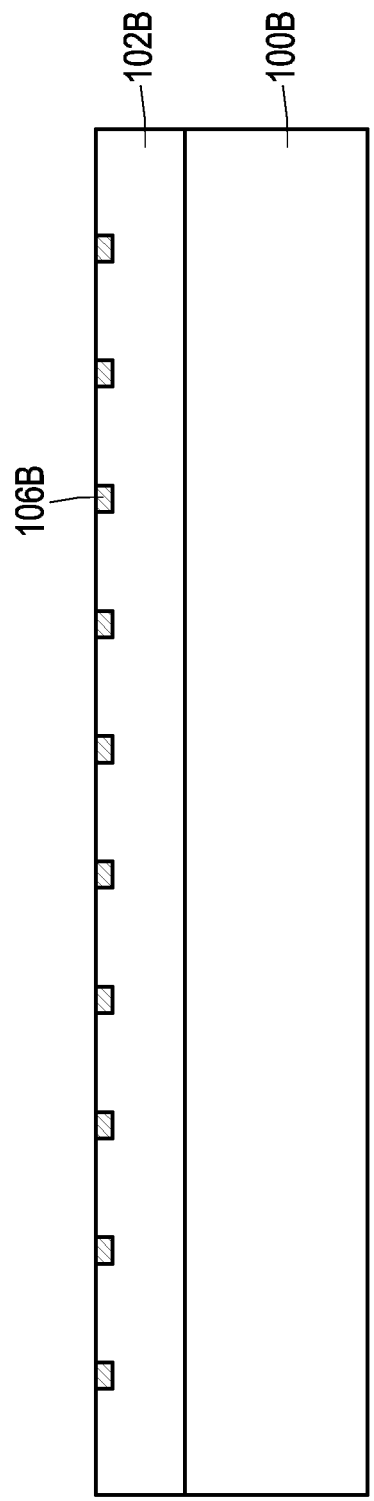
FIG. 5A
FIG. 5B

MANUFACTURING METHOD OF SEMICONDUCTOR STRUCTURE

CROSS-REFERENCE TO RELATED APPLICATION

This application claims the priority benefit of Taiwan application serial no. 111121227, filed on Jun. 8, 2022. The entirety of the above-mentioned patent application is hereby incorporated by reference herein and made a part of this specification.

BACKGROUND

Technical Field

The invention relates to a semiconductor manufacturing process, and particularly relates to a manufacturing method of a semiconductor structure.

Description of Related Art

The wafer is deformed (e.g., bowing or warpage) due to the stress applied to the wafer by the film layer on the wafer. During the wafer bonding process, if the wafer is deformed, the bonding defect will occur. For example, the bonding defect include the formation of the edge crack on the wafer, the formation of the bubble between the bonding surfaces of the wafers resulting in a decrease in the bonding strength, or the occurrence of the misalignment between the wafers after bonding.

SUMMARY

The invention provides a manufacturing method of a semiconductor structure, which can prevent the occurrence of the bonding defect.

The invention provides a manufacturing method of a semiconductor structure, which includes the following steps. A first substrate is provided. A first dielectric structure is formed on the first substrate. At least one first cavity is formed in the first dielectric structure. A first stress adjustment layer is formed in the first cavity. The first stress adjustment layer covers the first dielectric structure. A second substrate is provided. A second dielectric structure is formed on the second substrate. At least one second cavity is formed in the second dielectric structure. A second stress adjustment layer is formed in the second cavity. The second stress adjustment layer covers the second dielectric structure. The first stress adjustment layer and the second stress adjustment layer are bonded.

According to an embodiment of the invention, in the manufacturing method of the semiconductor structure, the method of bonding the first stress adjustment layer and the second stress adjustment layer may be a fusion bonding method.

According to an embodiment of the invention, the manufacturing method of the semiconductor structure may further include the following steps. A first bonding pad is formed in the first stress adjustment layer. A second bonding pad is formed in the second stress adjustment layer. The first bonding pad and the second bonding pad are bonded.

According to an embodiment of the invention, in the manufacturing method of the semiconductor structure, the step of bonding the first stress adjustment layer and the second stress adjustment layer and the step of bonding the first bonding pad and the second bonding pad may be performed simultaneously.

According to an embodiment of the invention, in the manufacturing method of the semiconductor structure, the method of bonding the first stress adjustment layer and the second stress adjustment layer and bonding the first bonding pad and the second bonding pad may be a hybrid bonding method.

According to an embodiment of the invention, in the manufacturing method of the semiconductor structure, the first cavity may pass through the first dielectric structure and may expose a portion of the first substrate.

According to an embodiment of the invention, in the manufacturing method of the semiconductor structure, the second cavity may pass through the second dielectric structure and may expose a portion of the second substrate.

According to an embodiment of the invention, in the manufacturing method of the semiconductor structure, the first substrate may include a first scribe line region and a first chip region. The first cavity may be located in at least one of the first scribe line region and the first chip region. The second substrate may include a second scribe line region and a second chip region. The second cavity may be located in at least one of the second scribe line region and the second chip region.

According to an embodiment of the invention, the manufacturing method of the semiconductor structure may further include the following step. A chemical mechanical polishing (CMP) process is performed on the first stress adjustment layer.

According to an embodiment of the invention, the manufacturing method of the semiconductor structure may further include the following step. A CMP process is performed on the second stress adjustment layer.

According to an embodiment of the invention, the manufacturing method of the semiconductor structure may further include the following steps. The deformation information of the first substrate is measured after forming the first cavity and before forming the first stress adjustment layer. The stress type and the stress value of the first stress adjustment layer are determined according to the deformation information of the first substrate. The deformation information of the second substrate is measured after forming the second cavity and before forming the second stress adjustment layer. The stress type and stress value of the second stress adjustment layer are determined according to the deformation information of the second substrate.

The invention provides another manufacturing method of a semiconductor structure, which includes the following steps. A first substrate is provided. A first dielectric structure is formed on the first substrate. At least one cavity is formed in the first dielectric structure. A stress adjustment layer is formed in the cavity. The stress adjustment layer covers the first dielectric structure. A second substrate is provided. A second dielectric structure is formed on the second substrate. The stress adjustment layer and the second dielectric structure are bonded.

According to another embodiment of the invention, in the manufacturing method of the semiconductor structure, the method of bonding the stress adjustment layer and the second dielectric structure may be a fusion bonding method.

According to another embodiment of the invention, the manufacturing method of the semiconductor structure may further include the following steps. A first bonding pad is formed in the stress adjustment layer. A second bonding pad is formed in the second dielectric structure. The first bonding pad and the second bonding pad are bonded.

According to another embodiment of the invention, in the manufacturing method of the semiconductor structure, the step of bonding the stress adjustment layer and the second dielectric structure and the step of bonding the first bonding pad and the second bonding pad may be performed simultaneously.

According to another embodiment of the invention, in the manufacturing method of the semiconductor structure, the method of bonding the stress adjustment layer and the second dielectric structure and bonding the first bonding pad and the second bonding pad may be a hybrid bonding method.

According to another embodiment of the invention, in the manufacturing method of the semiconductor structure, the cavity may pass through the first dielectric structure and may expose a portion of the first substrate.

According to another embodiment of the invention, in the manufacturing method of the semiconductor structure, the first substrate may include a scribe line region and a chip region. The cavity may be located in at least one of the scribe line region and the chip region.

According to another embodiment of the invention, the manufacturing method of the semiconductor structure may further include the following step. A CMP process is performed on the stress adjustment layer.

According to another embodiment of the invention, the manufacturing method of the semiconductor structure may further include the following steps. The deformation information of the first substrate is measured after forming the cavity and before forming the stress adjustment layer. The deformation information of the second substrate is measured after forming the second dielectric structure. The stress type and the stress value of the stress adjustment layer are determined according to the deformation information of the first substrate and the deformation information of the second substrate.

Based on the above description, in the manufacturing method of the semiconductor structure according to some embodiments of the invention, at least one first cavity is formed in the first dielectric structure, the first stress adjustment layer is formed in the first cavity, and the first stress adjustment layer covers the first dielectric structure, at least one second cavity is formed in the second dielectric structure, the second stress adjustment layer is formed in the second cavity, the second stress adjustment layer covers the second dielectric structure, and the first stress adjustment layer and the second stress adjustment layer are bonded. Since the first cavity formed in the first dielectric structure has the function of releasing stress, the deformation (e.g., bowing or warpage) of the first substrate can be suppressed, thereby preventing the occurrence of the bonding defect. In addition, since the second cavity formed in the second dielectric structure has the function of releasing stress, the deformation (e.g., bowing or warpage) of the second substrate can be suppressed, thereby preventing the occurrence of the bonding defect. Furthermore, the first stress adjustment layer can be used to adjust the stress applied to the first substrate, and the second stress adjustment layer can be used to adjust the stress applied to the second substrate, thereby preventing the occurrence of the bonding defect.

On the other hand, in the manufacturing method of the semiconductor structure according to another embodiment of the invention, at least one cavity is formed in the first dielectric structure, the stress adjustment layer is formed in the cavity, the stress adjustment layer covers the first dielectric structure, and the stress adjustment layer and the second dielectric structure are bonded. Since the cavity formed in the first dielectric structure has the function of releasing stress, the deformation (e.g., bowing or warpage) of the first substrate can be suppressed, thereby preventing the occurrence of the bonding defect. In addition, the stress adjustment layer can be used to adjust the stress applied to the first substrate, thereby preventing the occurrence of the bonding defect.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1G are cross-sectional views illustrating a manufacturing process of a semiconductor structure according to some embodiments of the invention.

FIG. 3A to FIG. 3C are cross-sectional views illustrating a manufacturing process of a semiconductor structure according to other embodiments of the invention.

FIG. 4A to FIG. 4C are cross-sectional views illustrating a manufacturing process of a semiconductor structure according to other embodiments of the invention.

FIG. 5A to FIG. 5C are cross-sectional views illustrating a manufacturing process of a semiconductor structure according to other embodiments of the invention.

DESCRIPTION OF THE EMBODIMENTS

Figure 1E:
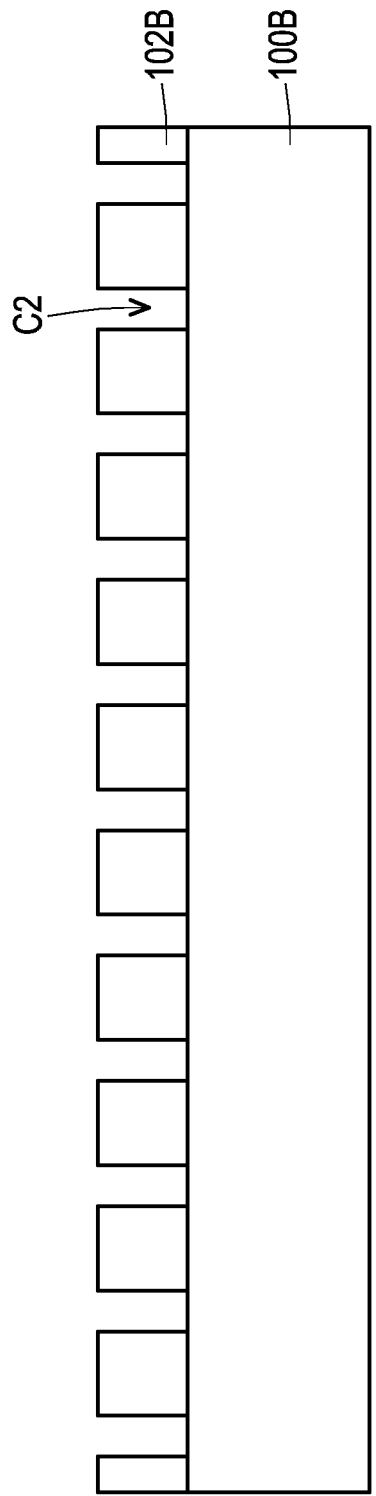

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

FIG. 1A to FIG. 1G are cross-sectional views illustrating a manufacturing process of a semiconductor structure according to some embodiments of the invention. FIG. 2A and FIG. 2B are top views of substrates according to some embodiments of the invention.

Referring to FIG. 1A, a substrate 100A is provided. In some embodiments, as shown in FIG. 2A, the substrate 100A may include a scribe line region RSL1 and a chip region RC1. The scribe line region RSL1 may be used to define the chip region RC1. The substrate 100A may be a semiconductor substrate such as a silicon substrate. In some embodiments, an isolation structure (not shown) may be formed in substrate 100A. The isolation structure is, for example, a shallow trench isolation (STI) structure. The material of the isolation structure is, for example, silicon oxide.

Referring to FIG. 1A, a dielectric structure 102A is formed on the substrate 100A. In some embodiments, the dielectric structure 102A may be a multilayer structure. In some embodiments, the dielectric structure 102A may include a dielectric layer of a front end of line (FEOL) process and a dielectric layer of a back end of line (BEOL) process. The material of the structure 102A is, for example, silicon oxide, silicon nitride, silicon oxynitride (SiON), silicon carbonitride (SiCN), a low dielectric constant (low-k) material, or a combination thereof.

In addition, although not shown in the figure, the required semiconductor device (e.g., active device and/or passive device) may be formed in the substrate 100A, on the substrate 100A, and/or in the dielectric structure 102A, and the required interconnection structure may be formed in the dielectric structure 102A, and the description thereof is omitted here.

In some embodiments, the layer (e.g., dielectric structure 102A) formed on the substrate 100A may apply stress on the substrate 100A, thereby causing the substrate 100A to deform (e.g., bowing or warpage).

Referring to FIG. 1B, at least one cavity C1 is formed in the dielectric structure 102A. Since the cavity C1 formed in the dielectric structure 102A has the function of releasing stress, the deformation (e.g., bowing or warpage) of the substrate 100A can be suppressed. In some embodiments, the cavity C1 may be located in at least one of the scribe line region RSL1 and the chip region RC1 of FIG. 2A. In some embodiments, when the cavity C1 is located in the chip region RC1, the cavity C1 may be located in a dummy region of the chip region RC1. In the present embodiment, the number of the cavities C1 is, for example, multiple, but is not limited to the number in the figure. As long as the number of the cavities C1 is at least one, it falls within the scope of the invention. In some embodiments, the cavity C1 may be formed by removing a portion of the dielectric structure 102A by a lithography process and an etching process (e.g., dry etching process). In some embodiments, the etching process used to form the cavity C1 only removes the dielectric material.

In the present embodiment, the cavity C1 may pass through the dielectric structure 102A and may expose a portion of the substrate 100A, but the invention is not limited thereto. In other embodiments, the cavity C1 may pass through the dielectric structure 102A and may extend into the substrate 100A or into the isolation structure (not shown). When the cavity C1 passes through the dielectric structure 102A and extends into the substrate 100A, the etching process used to form the cavity C1 may remove a portion of the dielectric structure 102A and a portion of the substrate 100A. When the cavity C1 passes through the dielectric structure 102A and extends into the isolation structure, the etching process used to form the cavity C1 may remove a portion of the dielectric structure 102A and a portion of the isolation structure. In other embodiments, the cavity C1 may not pass through the dielectric structure 102A. In some embodiments, the cavities C1 may be separated from each other or communicated with each other.

Referring to FIG. 1C, a stress adjustment layer 104A is formed in the cavity C1. The stress adjustment layer 104A covers the dielectric structure 102A. The stress adjustment layer 104A can be used to adjust the stress applied to the substrate 100A. In some embodiments, the stress adjustment layer 104A may have a tensile stress or a compressive stress. The material of the stress adjustment layer 104A is, for example, silicon oxide, silicon nitride, silicon oxynitride, silicon carbonitride, or a combination thereof. In some embodiments, a CMP process may be performed on the stress adjustment layer 104A, so the stress adjustment layer 104A may have a flat surface.

In some embodiments, the deformation information of the substrate 100A may be measured after forming the cavity C1 and before forming the stress adjustment layer 104A. In some embodiments, the stress type (e.g., tensile stress or compressive stress) and the stress value of the stress adjustment layer 104A may be determined according to the deformation information of the substrate 100A.

Referring to FIG. 1D, a substrate 100B is provided. In some embodiments, as shown in FIG. 2B, the substrate 100B may include a scribe line region RSL2 and a chip region RC2. The scribe line region RSL2 may be used to define the chip region RC2. The substrate 100B may be a semiconductor substrate such as a silicon substrate. In some embodiments, there may be an isolation structure (not shown) in the substrate 100B. The isolation structure is, for example, a shallow trench isolation (STI) structure. The material of the isolation structure is, for example, silicon oxide.

Referring to FIG. 1D, a dielectric structure 102B is formed on the substrate 100B. In some embodiments, the dielectric structure 102B may be a multilayer structure. In some embodiments, the dielectric structure 102B may include a dielectric layer of a FEOL process and a dielectric layer of a BEOL process. The material of the dielectric structure 102B is, for example, silicon oxide, silicon nitride, silicon oxynitride, silicon carbonitride, or a combination thereof.

In addition, although not shown in the figure, the required semiconductor device (e.g., active device and/or passive device) may be formed in the substrate 100B, on the substrate 100B, and/or in the dielectric structure 102B, and the required interconnection structure may be formed in the dielectric structure 102B, and the description thereof is omitted here.

In some embodiments, the layer (e.g., dielectric structure 102B) formed on the substrate 100B may apply stress on the substrate 100B, thereby causing the substrate 100B to deform (e.g., bowing or warpage).

Figure 2A:
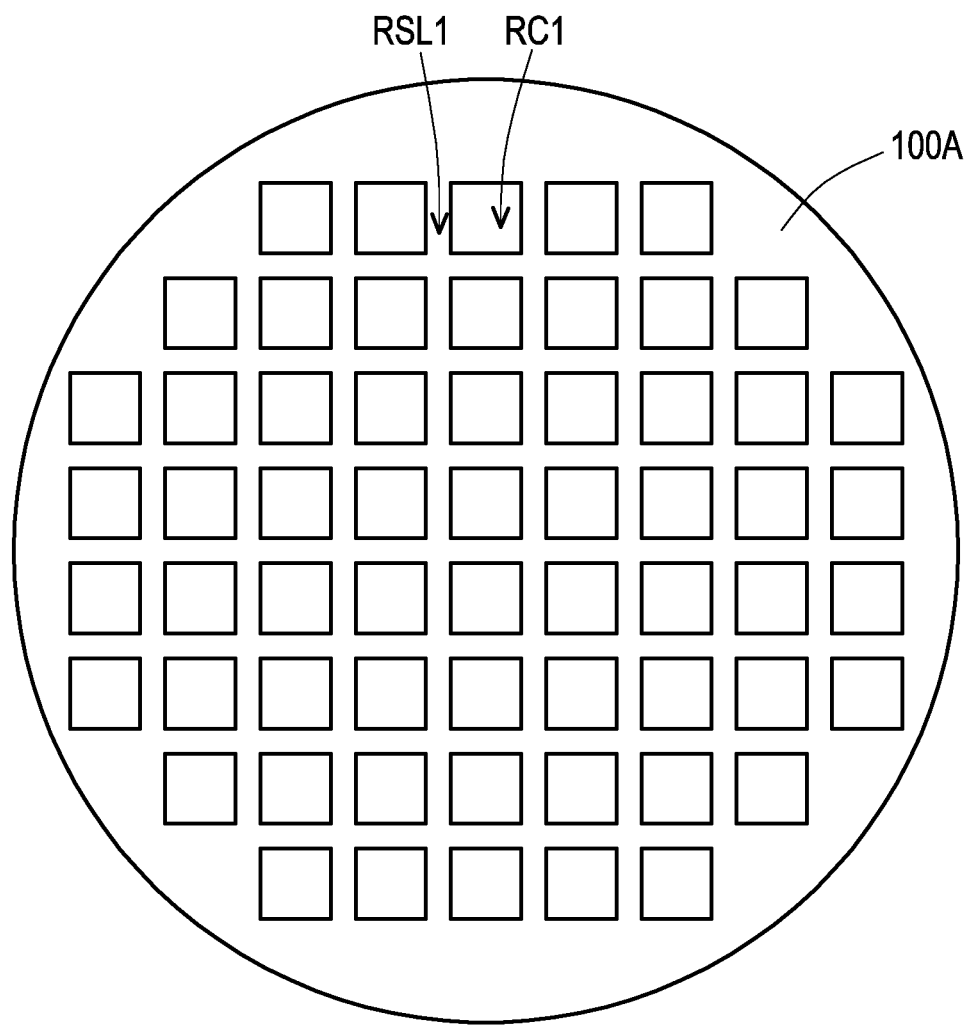
FIG. 2A and FIG. 2B are top views of substrates according to some embodiments of the invention.
Figure 2B:
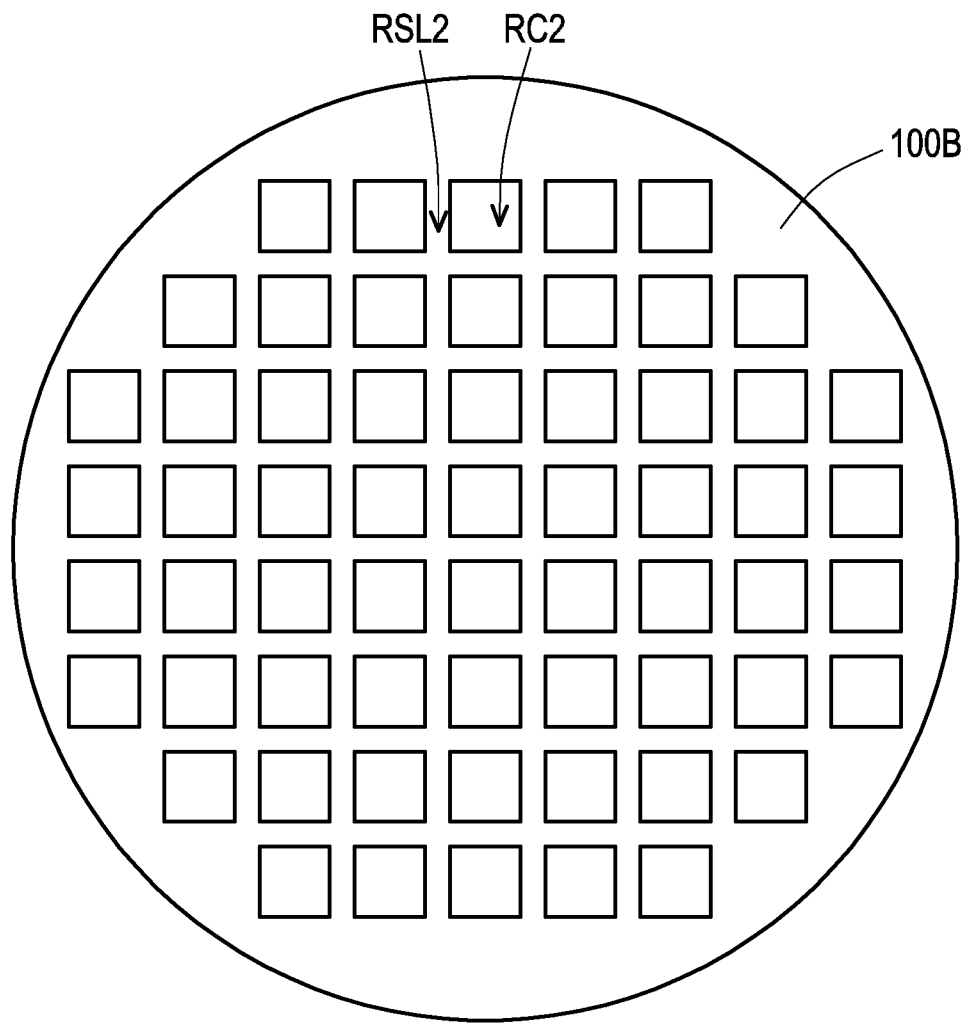

Referring to FIG. 1E, at least one cavity C2 is formed in the dielectric structure 102B. Since the cavity C2 formed in the dielectric structure 102B has the function of releasing stress, the deformation (e.g., bowing or warpage) of the substrate 100B can be suppressed. In some embodiments, the cavity C2 may be located in at least one of the scribe line region RSL2 and the chip region RC2 of FIG. 2B. In some embodiments, when the cavity C2 is located in the chip region RC2, the cavity C2 may be located in a dummy region of the chip region RC2. In the present embodiment, the number of the cavities C2 is, for example, multiple, but is not limited to the number in the figure. As long as the number of the cavities C2 is at least one, it falls within the scope of the invention. In some embodiments, the cavity C2 may be formed by removing a portion of the dielectric structure 102B by a lithography process and an etching process (e.g., dry etching process). In some embodiments, the etch process used to form the cavity C2 only removes the dielectric material.

In the present embodiment, the cavity C2 may pass through the dielectric structure 102B and may expose a portion of the substrate 100B, but the invention is not limited thereto. In other embodiments, the cavity C2 may pass through the dielectric structure 102B and may extend into the substrate 100B or into the isolation structure (not shown). When the cavity C2 passes through the dielectric structure 102B and extends into the substrate 100B, the etching process used to form the cavity C2 may remove a portion of the dielectric structure 102B and a portion of the substrate 100B. When the cavity C2 passes through the dielectric structure 102B and extends into the isolation structure, the etching process used to form the cavity C2 may remove a portion of the dielectric structure 102B and a portion of the isolation structure. In other embodiments, the cavity C2 may not pass through the dielectric structure 102B. In some embodiments, the cavities C2 may be separated from each other or communicated with each other.

Figure 1F:
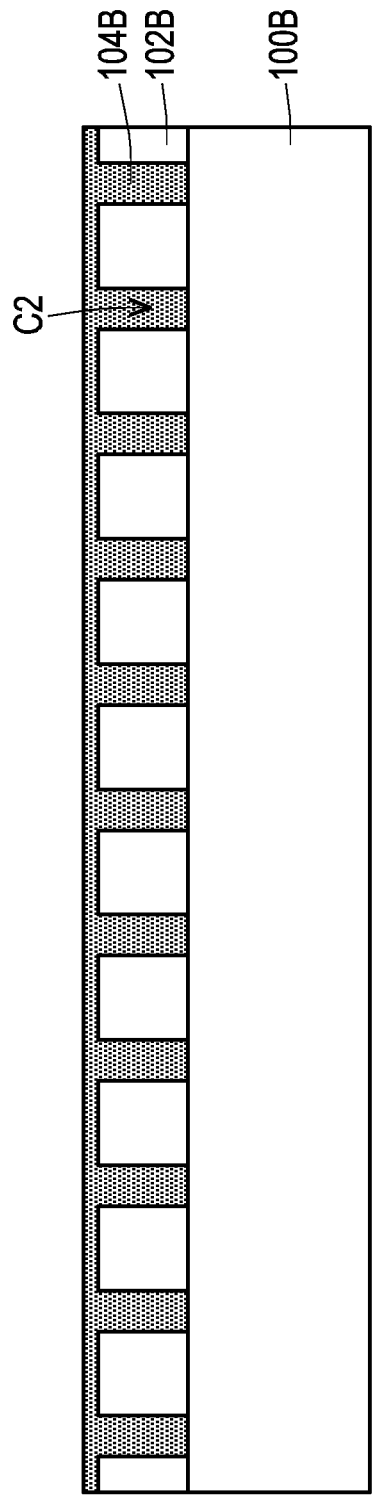

Referring to FIG. 1F, a stress adjustment layer 104B is formed in the cavity C2. The stress adjustment layer 104B covers the dielectric structure 102B. The stress adjustment layer 104B can be used to adjust the stress applied to the substrate 100B. In some embodiments, the stress adjustment layer 104B may have a tensile stress or a compressive stress. The material of the stress adjustment layer 104B is, for example, silicon oxide, silicon nitride, silicon oxynitride, silicon carbonitride, or a combination thereof. In some embodiments, a CMP process may be performed on the stress adjustment layer 104B, so the stress adjustment layer 104B may have a flat surface.

In some embodiments, the deformation information of the substrate 100B may be measured after forming the cavity C2 and before forming the stress adjustment layer 104B. In some embodiments, the stress type (e.g., tensile stress or compressive stress) and the stress value of the stress adjustment layer 104B may be determined according to the deformation information of the substrate 100B.

Figure 1G:
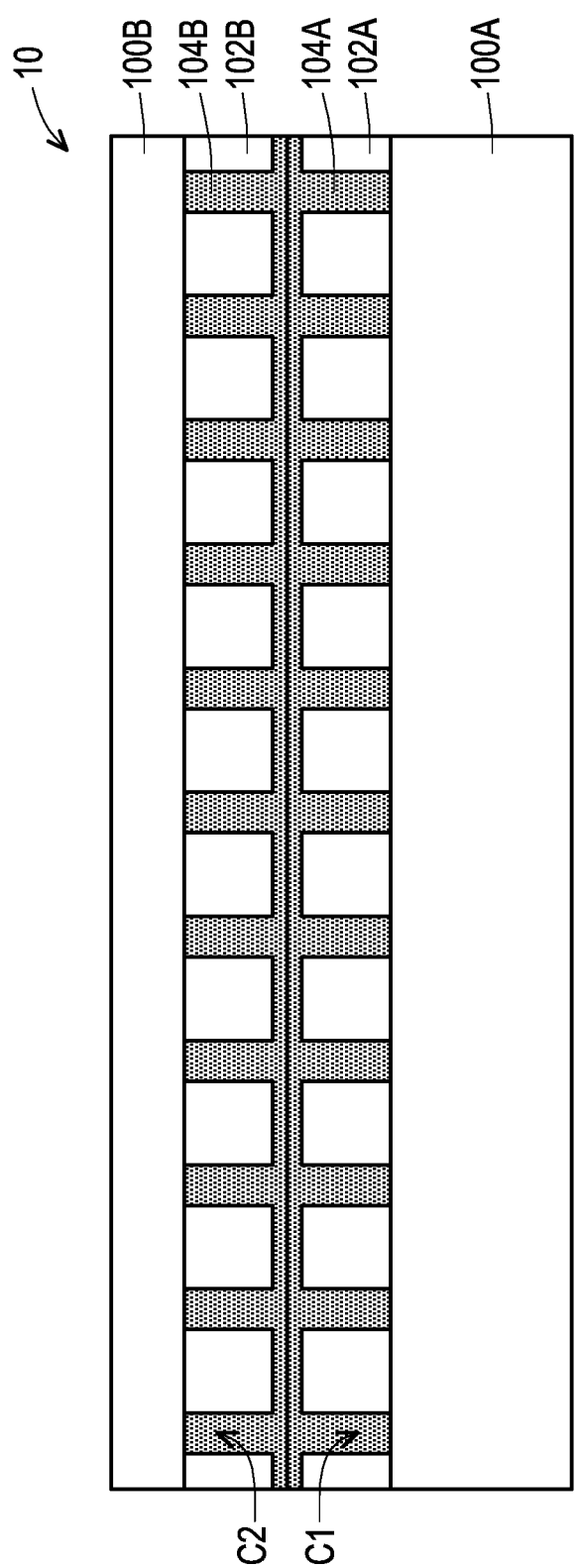

Referring to FIG. 1G, the stress adjustment layer 104A and the stress adjustment layer 104B are bonded. In some embodiments, the method of bonding the stress adjustment layer 104A and the stress adjustment layer 104B may be a fusion bonding method. In some embodiments, a post-bonding annealing process may be performed to increase the bonding strength.

A thinning process may be performed on the substrate 100A or the substrate 100B. In the present embodiment, the thinning process is performed on the substrate 100B, for example, but the invention is not limited thereto. In other embodiments, the thinning process may be performed on the substrate 100A. The thinning process is, for example, a grinding process, a wet etching process, or a CMP process.

In some embodiments, a through-substrate via (TSV) (not shown) may be formed in the substrate 100A and/or the substrate 100B when the bonding process is performed by the fusion bonding method. The TSV may include a via-first TSV, a via-middle TSV, a via-last TSV, or a via after bonding TSV. In the present embodiment, the via-first TSV refers to the TSV formed before the transistor is formed, and the via-middle TSV refers to the TSV formed after the transistor is formed and before the BEOL process, the via-last TSV refers to the TSV formed after the BEOL process, and the via after bonding TSV refers to the TSV formed after the bonding process. In addition, the method of forming the TSV is well known to one of ordinary skill in the art, and the description thereof is omitted here.

Based on the above embodiments, in the manufacturing method of the semiconductor structure 10, at least one cavity C1 is formed in the dielectric structure 102A, the stress adjustment layer 104A is formed in the cavity C1, the stress adjustment layer 104A covers the dielectric structure 102A, at least one cavity C2 is formed in the dielectric structure 102B, the stress adjustment layer 104B is formed in the cavity C2, the stress adjustment layer 104B covers the dielectric structure 102B, and the stress adjustment layer 104A and the stress adjustment layer 104B are bonded. Since the cavity C1 formed in the dielectric structure 102A has the function of releasing stress, the deformation (e.g., bowing or warpage) of the substrate 100A can be suppressed, thereby preventing the occurrence of the bonding defect. In addition, since the cavity C2 formed in the dielectric structure 102B has the function of releasing stress, the deformation (e.g., bowing or warpage) of the substrate 100B can be suppressed, thereby preventing the occurrence of the bonding defect. Furthermore, the stress adjustment layer 104A can be used to adjust the stress applied to the substrate 100A, and the stress adjustment layer 104B can be used to adjust the stress applied to the substrate 100B, thereby preventing the occurrence of the bonding defect. In the text, the bonding defect may include the formation of the edge crack on the substrate 100A and/or the substrate 100B, the formation of the bubble between the bonding surfaces of the substrate 100A and the substrate 100B resulting in a decrease in the bonding strength, or the occurrence of the misalignment between the substrate 100A and the substrate 100B after the bonding.

Figure 3C:
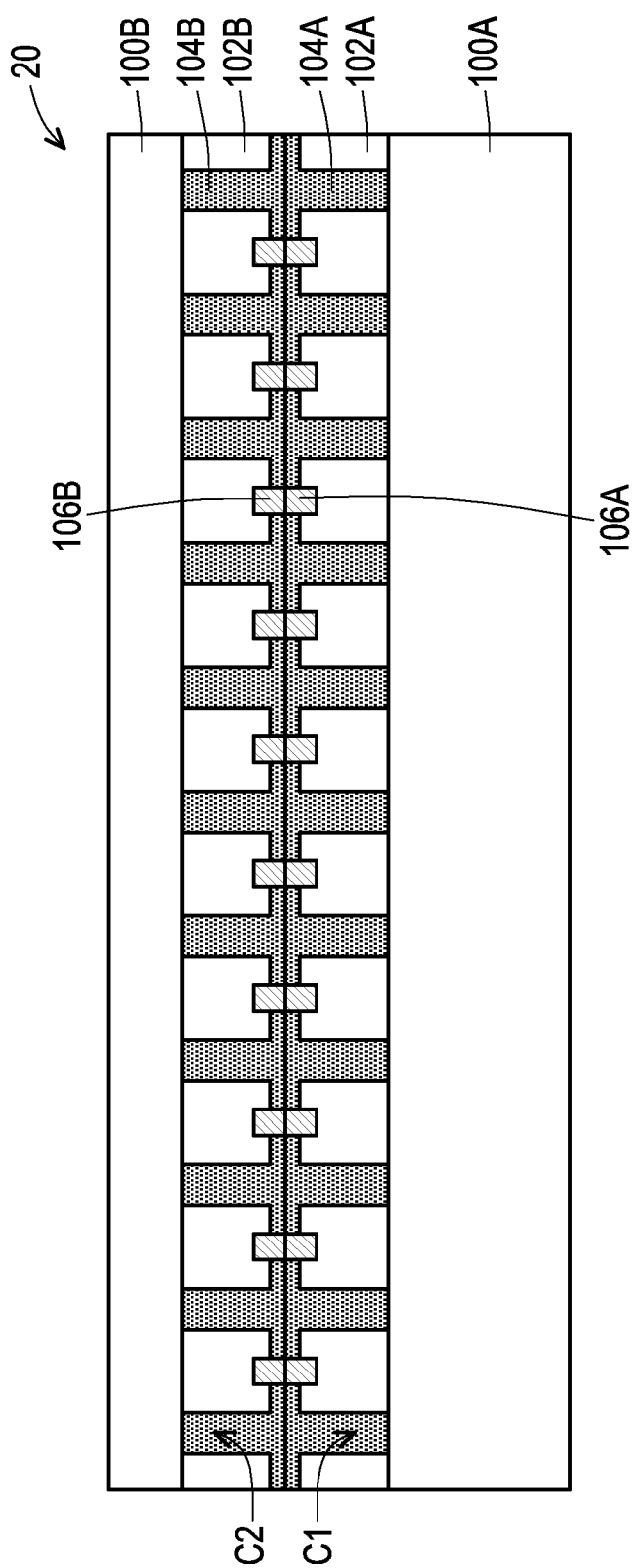

FIG. 3A to FIG. 3C are cross-sectional views illustrating a manufacturing process of a semiconductor structure according to other embodiments of the invention.

Referring to FIG. 3A, the structure of FIG. 1C is provided. In addition, the structure of FIG. 1C and the manufacturing method thereof have been described in detail in the above embodiments, and the description thereof is not repeated here. A bonding pad 106A may be formed in the stress adjustment layer 104A. In some embodiments, the bonding pad 106A may be electrically connected to an interconnect structure (not shown) in the dielectric structure 102A. In some embodiments, the bonding pad 106A may extend into the dielectric structure 102A. The material of the bonding pad 106A is, for example, copper. In some embodiments, the bonding pad 106A may be formed by a damascene process.

Referring to FIG. 3B, the structure of FIG. 1F is provided. In addition, the structure of FIG. 1F and the manufacturing method thereof have been described in detail in the above embodiments, and the description thereof is not repeated here. A bonding pad 106B may be formed in the stress adjustment layer 104B. In some embodiments, the bonding pad 106B may be electrically connected to an interconnect structure (not shown) in the dielectric structure 102B. In some embodiments, the bonding pad 106B may extend into the dielectric structure 102B. The material of the bonding pad 106B is, for example, copper. In some embodiments, the bonding pad 106B may be formed by a damascene process.

Referring to FIG. 3C, the stress adjustment layer 104A and the stress adjustment layer 104B are bonded. In addition, the bonding pad 106A and the bonding pad 106B may be bonded. In some embodiments, the step of bonding the stress adjustment layer 104A and the stress adjustment layer 104B and the step of bonding the bonding pad 106A and the bonding pad 106B may be performed simultaneously. In some embodiments, the method of bonding the stress adjustment layer 104A and the stress adjustment layer 104B and bonding the bonding pad 106A and the bonding pad 106B may be a hybrid bonding method. In some embodiments, a post-bonding annealing process may be performed to increase the bonding strength.

A thinning process may be performed on the substrate 100A or the substrate 100B. In the present embodiment, the thinning process is performed on the substrate 100B, for example, but the invention is not limited thereto. In other embodiments, the thinning process may be performed on the substrate 100A. The thinning process is, for example, a grinding process, a wet etching process, or a CMP process.

Based on the above embodiments, in the manufacturing method of the semiconductor structure 20, at least one cavity C1 is formed in the dielectric structure 102A, the stress adjustment layer 104A is formed in the cavity C1, the stress adjustment layer 104A covers the dielectric structure 102A, at least one cavity C2 is formed in the dielectric structure 102B, the stress adjustment layer 104B is formed in the cavity C2, the stress adjustment layer 104B covers the dielectric structure 102B, and the stress adjustment layer 104A and the stress adjustment layer 104B are bonded. Since the cavity C1 formed in the dielectric structure 102A has the function of releasing stress, the deformation (e.g., bowing or warpage) of the substrate 100A can be suppressed, thereby preventing the occurrence of the bonding defect. In addition, since the cavity C2 formed in the dielectric structure 102B has the function of releasing stress, the deformation (e.g., bowing or warpage) of the substrate 100B can be suppressed, thereby preventing the occurrence of the bonding defect. Furthermore, the stress adjustment layer 104A can be used to adjust the stress applied to the substrate 100A, and the stress adjustment layer 104B can be used to adjust the stress applied to the substrate 100B, thereby preventing the occurrence of the bonding defect.

Figure 4C:
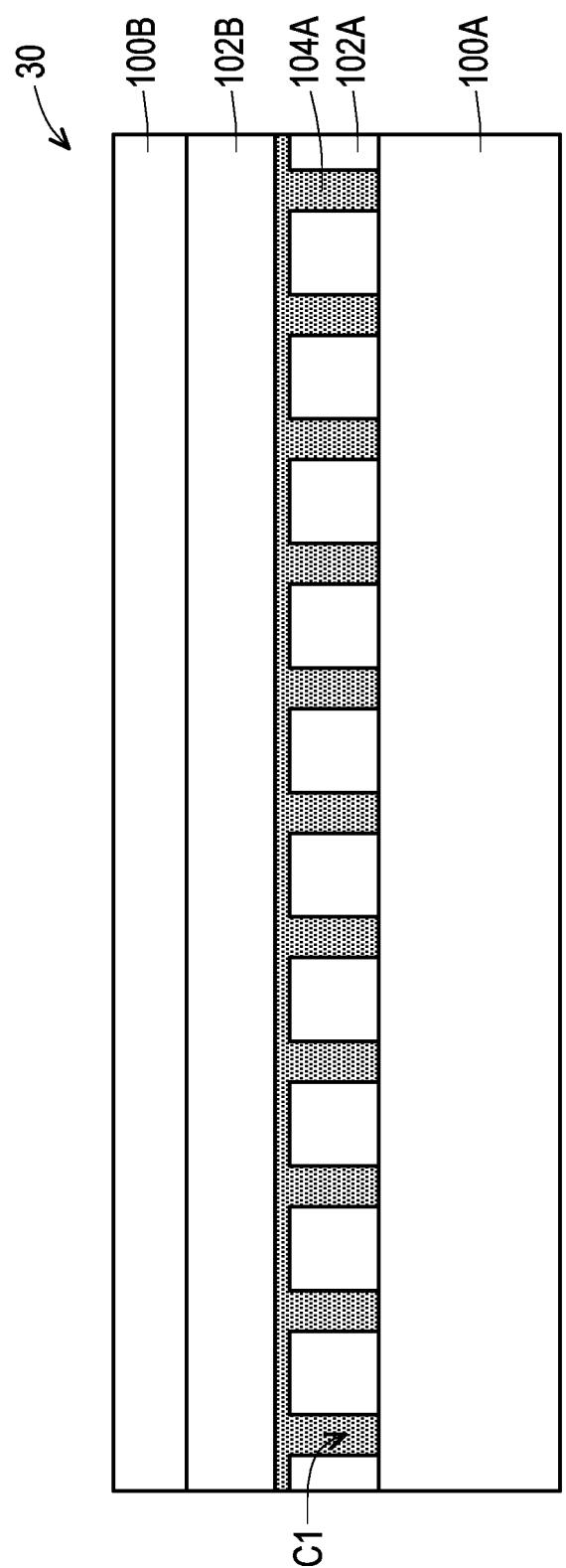

FIG. 4A to FIG. 4C are cross-sectional views illustrating a manufacturing process of a semiconductor structure according to other embodiments of the invention.

Referring to FIG. 4A, the structure of FIG. 1C is provided. In addition, the structure of FIG. 1C and the manufacturing method thereof have been described in detail in the above embodiments, and the description thereof is not repeated here.

Referring to FIG. 4B, the structure of FIG. 1D is provided. In addition, the structure of FIG. 1D and the manufacturing method thereof have been described in detail in the above embodiments, and the description thereof is not repeated here.

In some embodiments, the deformation information of the substrate 100A may be measured after forming the cavity C1 and before forming the stress adjustment layer 104A. In addition, the deformation information of the substrate 100B may be measured after forming the dielectric structure 102B. In some embodiments, the stress type and the stress value of the stress adjustment layer 104A in FIG. 4A may be determined according to the deformation information of the substrate 100A and the deformation information of the substrate 100B. For example, if the substrate 100B is bent, the stress applied to the substrate 100A can be adjusted by the stress adjustment layer 104A, thereby adjusting the bending degree of the substrate 100A. In this way, when the stress adjustment layer 104A and the dielectric structure 102B are subsequently bonded, the bonding surface of the stress adjustment layer 104A on the substrate 100A and the bonding surface of the dielectric structure 102B on the substrate 100B can be matched with each other to facilitate the bonding process.

Referring to FIG. 4C, the stress adjustment layer 104A and the dielectric structure 102B are bonded. In some embodiments, the method of bonding the stress adjustment layer 104A and the dielectric structure 102B may be a fusion bonding method. In some embodiments, a post-bonding annealing process may be performed to increase the bonding strength.

A thinning process may be performed on the substrate 100A or the substrate 100B. In the present embodiment, the thinning process is performed on the substrate 100B, for example, but the invention is not limited thereto. In other embodiments, the thinning process may be performed on the substrate 100A. The thinning process is, for example, a grinding process, a wet etching process, or a CMP process.

In some embodiments, a TSV (not shown) may be formed in the substrate 100A and/or the substrate 100B when the bonding process is performed by the fusion bonding method. The TSV may include a via-first TSV, a via-middle TSV, a via-last TSV, or a via after bonding TSV. In addition, the method of forming the TSV is well known to one of ordinary skill in the art, and the description thereof is omitted here.

Based on the above embodiments, in the manufacturing method of the semiconductor structure 30, at least one cavity C1 is formed in the dielectric structure 102A, the stress adjustment layer 104A is formed in the cavity C1, the stress adjustment layer 104A covers the dielectric structure 102A, and the stress adjustment layer 104A and the dielectric structure 102B are bonded. Since the cavity C1 formed in the dielectric structure 102A has the function of releasing stress, the deformation (e.g., bowing or warpage) of the substrate 100A can be suppressed, thereby preventing the occurrence of the bonding defect. In addition, the stress adjustment layer 104A can be used to adjust the stress applied to the substrate 100A, thereby preventing the occurrence of the bonding defect.

Figure 5C:
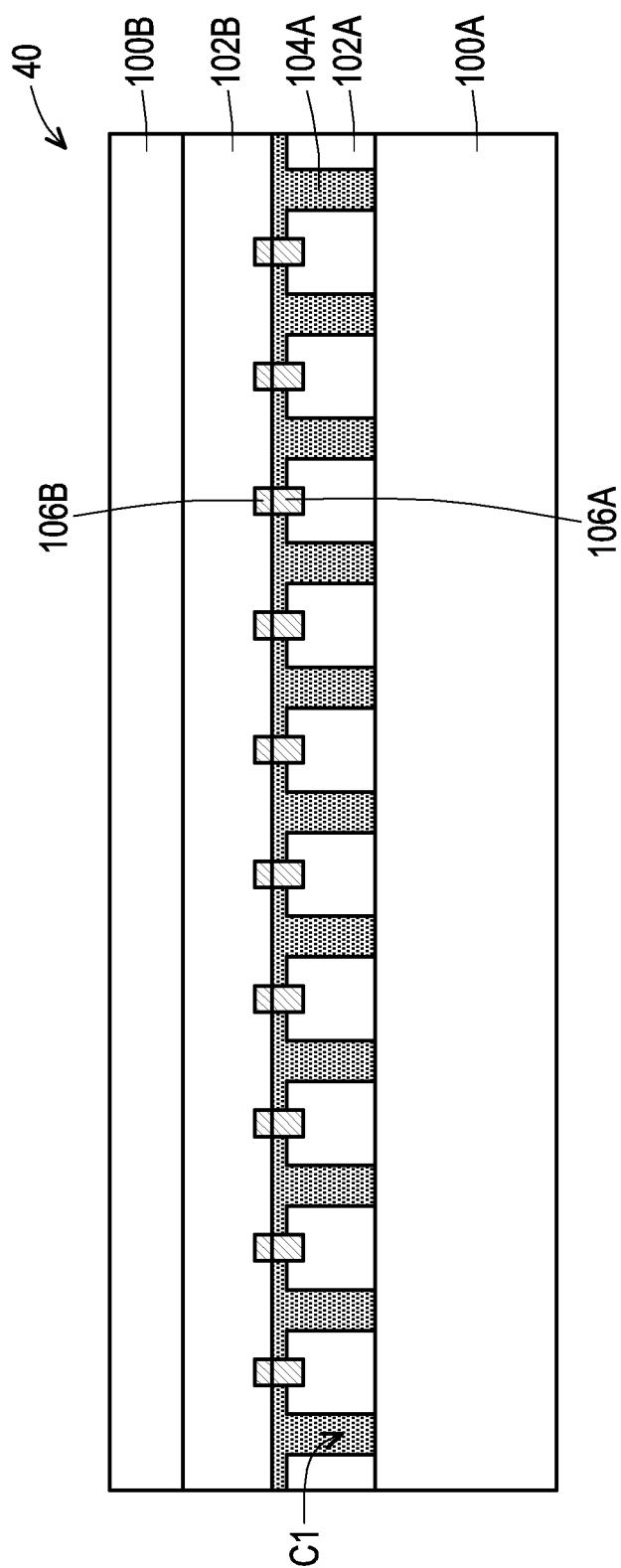

FIG. 5A to FIG. 5C are cross-sectional views illustrating a manufacturing process of a semiconductor structure according to other embodiments of the invention.

Referring to FIG. 5A, the structure of FIG. 1C is provided. In addition, the structure of FIG. 1C and the manufacturing method thereof have been described in detail in the above embodiments, and the description thereof is not repeated here. A bonding pad 106A may be formed in the stress adjustment layer 104A. In some embodiments, the bonding pad 106A may be electrically connected to an interconnect structure (not shown) in the dielectric structure 102A. In some embodiments, the bonding pad 106A may extend into the dielectric structure 102A. The material of the bonding pad 106A is, for example, copper. In some embodiments, the bonding pad 106A may be formed by a damascene process.

Referring to FIG. 5B, the structure of FIG. 1D is provided. In addition, the structure of FIG. 1D and the manufacturing method thereof have been described in detail in the above embodiments, and the description thereof is not repeated here. A bonding pad 106B may be formed in the dielectric structure 102B. In some embodiments, the bonding pad 106B may be electrically connected to an interconnect structure (not shown) in the dielectric structure 102B. The material of the bonding pad 106B is, for example, copper. In some embodiments, the bonding pad 106B may be formed by a damascene process.

In some embodiments, the deformation information of the substrate 100A may be measured after forming the cavity C1 and before forming the stress adjustment layer 104A. In addition, the deformation information of the substrate 100B may be measured after forming the dielectric structure 102B. In some embodiments, the stress type and the stress value of the stress adjustment layer 104A in FIG. 5A may be determined according to the deformation information of the substrate 100A and the deformation information of the substrate 100B. For example, if the substrate 100B is bent, the stress applied to the substrate 100A can be adjusted by the stress adjustment layer 104A, thereby adjusting the bending degree of the substrate 100A. In this way, when the stress adjustment layer 104A and the dielectric structure 102B are subsequently bonded, the bonding surface of the stress adjustment layer 104A on the substrate 100A and the bonding surface of the dielectric structure 102B on the substrate 100B can be matched with each other to facilitate the bonding process.

Referring to FIG. 5C, the stress adjustment layer 104A and the dielectric structure 102B are bonded. In addition, the bonding pad 106A and the bonding pad 106B may be bonded. In some embodiments, the step of bonding the stress adjustment layer 104A and the dielectric structure 102B and the step of bonding the bonding pad 106A and the bonding pad 106B may be performed simultaneously. In some embodiments, the method of bonding the stress adjustment layer 104A and the dielectric structure 102B and bonding the bonding pad 106A and the bonding pad 106B may be a hybrid bonding method. In some embodiments, a post-bonding annealing process may be performed to increase the bonding strength.

A thinning process may be performed on the substrate 100A or the substrate 100B. In the present embodiment, the thinning process is performed on the substrate 100B, for example, but the invention is not limited thereto. In other embodiments, the thinning process may be performed on the substrate 100A. The thinning process is, for example, a grinding process, a wet etching process, or a CMP process.

Based on the above embodiments, in the manufacturing method of the semiconductor structure 40, at least one cavity C1 is formed in the dielectric structure 102A, the stress adjustment layer 104A is formed in the cavity C1, the stress adjustment layer 104A covers the dielectric structure 102A, and the stress adjustment layer 104A and the dielectric structure 102B are bonded. Since the cavity C1 formed in the dielectric structure 102A has the function of releasing stress, the deformation (e.g., bowing or warpage) of the substrate 100A can be suppressed, thereby preventing the occurrence of the bonding defect. In addition, the stress adjustment layer 104A can be used to adjust the stress applied to the substrate 100A, thereby preventing the occurrence of the bonding defect.

In summary, in the manufacturing method of the semiconductor structure of the aforementioned embodiments, the stress can be released by the cavity, and the stress applied on the substrate can be adjusted by the stress adjustment layer, thereby preventing the occurrence of the bonding defect.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a semiconductor structure, comprising:
    providing a first substrate;
    forming a first dielectric structure on the first substrate;
    forming at least one first cavity in the first dielectric structure;
    forming a first stress adjustment layer in the first cavity, wherein the first stress adjustment layer covers the first dielectric structure;
    providing a second substrate;
    forming a second dielectric structure on the second substrate;
    forming at least one second cavity in the second dielectric structure;
    forming a second stress adjustment layer in the second cavity, wherein the second stress adjustment layer covers the second dielectric structure; and
    bonding the first stress adjustment layer and the second stress adjustment layer.

2. The manufacturing method of the semiconductor structure according to claim 1, wherein a method of bonding the first stress adjustment layer and the second stress adjustment layer comprises a fusion bonding method.

3. The manufacturing method of the semiconductor structure according to claim 1, further comprising:
    forming a first bonding pad in the first stress adjustment layer;
    forming a second bonding pad in the second stress adjustment layer; and
    bonding the first bonding pad and the second bonding pad.

4. The manufacturing method of the semiconductor structure according to claim 3, wherein the step of bonding the first stress adjustment layer and the second stress adjustment layer and the step of bonding the first bonding pad and the second bonding pad are performed simultaneously.

5. The manufacturing method of the semiconductor structure according to claim 3, wherein a method of bonding the first stress adjustment layer and the second stress adjustment layer and bonding the first bonding pad and the second bonding pad comprises a hybrid bonding method.

6. The manufacturing method of the semiconductor structure according to claim 1, wherein the first cavity passes through the first dielectric structure and exposes a portion of the first substrate.

7. The manufacturing method of the semiconductor structure according to claim 1, wherein the second cavity passes through the second dielectric structure and exposes a portion of the second substrate.

8. The manufacturing method of the semiconductor structure according to claim 1, wherein
    the first substrate comprises a first scribe line region and a first chip region,
    the first cavity is located in at least one of the first scribe line region and the first chip region,
    the second substrate comprises a second scribe line region and a second chip region, and
    the second cavity is located in at least one of the second scribe line region and the second chip region.

9. The manufacturing method of the semiconductor structure according to claim 1, further comprising:
    performing a chemical mechanical polishing process on the first stress adjustment layer.

10. The manufacturing method of the semiconductor structure according to claim 1, further comprising:
    performing a chemical mechanical polishing process on the second stress adjustment layer.

11. The manufacturing method of the semiconductor structure according to claim 1, further comprising:
    measuring a deformation information of the first substrate after forming the first cavity and before forming the first stress adjustment layer;
    determining a stress type and a stress value of the first stress adjustment layer according to the deformation information of the first substrate;
    measuring a deformation information of the second substrate after forming the second cavity and before forming the second stress adjustment layer; and
    determining a stress type and a stress value of the second stress adjustment layer according to the deformation information of the second substrate.

12. A manufacturing method of a semiconductor structure, comprising:
    providing a first substrate;
    forming a first dielectric structure on the first substrate;

forming at least one cavity in the first dielectric structure;

forming a stress adjustment layer in the cavity, wherein the stress adjustment layer covers the first dielectric structure;

providing a second substrate;

forming a second dielectric structure on the second substrate; and bonding the stress adjustment layer and the second dielectric structure, wherein the cavity passes through the first dielectric structure and exposes a portion of the first substrate.

13. The manufacturing method of the semiconductor structure according to claim 12, wherein a method of bonding the stress adjustment layer and the second dielectric structure comprises a fusion bonding method.

14. The manufacturing method of the semiconductor structure according to claim 12, further comprising:

forming a first bonding pad in the stress adjustment layer;

forming a second bonding pad in the second dielectric structure; and bonding the first bonding pad and the second bonding pad.

15. The manufacturing method of the semiconductor structure according to claim 14, wherein the step of bonding the stress adjustment layer and the second dielectric structure and the step of bonding the first bonding pad and the second bonding pad are performed simultaneously.

16. The manufacturing method of the semiconductor structure according to claim 14, wherein a method of bonding the stress adjustment layer and the second dielectric structure and bonding the first bonding pad and the second bonding pad comprises a hybrid bonding method.

17. The manufacturing method of the semiconductor structure according to claim 12, wherein the first substrate comprises a scribe line region and a chip region, and the cavity is located in at least one of the scribe line region and the chip region.

18. The manufacturing method of the semiconductor structure according to claim 12, further comprising:

performing a chemical mechanical polishing process on the stress adjustment layer.

19. The manufacturing method of the semiconductor structure according to claim 12, further comprising:

measuring a deformation information of the first substrate after forming the cavity and before forming the stress adjustment layer;

measuring a deformation information of the second substrate after forming the second dielectric structure; and determining a stress type and a stress value of the stress adjustment layer according to the deformation information of the first substrate and the deformation information of the second substrate.

* * * * *